United States Patent [19]

Connor et al.

[11] Patent Number: 5,539,753
[45] Date of Patent: Jul. 23, 1996

[54] METHOD AND APPARATUS FOR OUTPUT DESELECTING OF DATA DURING TEST

[75] Inventors: John P. Connor, Burlington; Stuart J. Hall, Underhill Center; Marcel J. Robillard, Williston; Luigi Ternullo, Jr., Colchester, all of Vt.

[73] Assignee: International Business Machines Corporation, Armonk, N.Y.

[21] Appl. No.: 512,688

[22] Filed: Aug. 10, 1995

[51] Int. Cl.⁶ .................................................. G06F 11/00
[52] U.S. Cl. ........................... 371/22.3; 395/183.06
[58] Field of Search ............... 395/183.06; 371/22.1, 371/22.3, 22.4, 22.5, 22.6, 27

[56] References Cited

U.S. PATENT DOCUMENTS

| | | | |
|---|---|---|---|
| 3,761,695 | 9/1973 | Eichelberger | 235/153 |
| 3,790,885 | 2/1974 | James | 324/73 |
| 4,216,539 | 8/1980 | Raymond et al. | 371/22.6 |
| 4,342,084 | 7/1982 | Sager et al. | 364/200 |
| 4,481,627 | 11/1984 | Beauchesne et al. | 371/21 |
| 4,484,329 | 11/1984 | Slamka et al. | 371/25 |
| 4,510,572 | 4/1985 | Reece et al. | 371/22.4 |
| 5,051,996 | 9/1991 | Bergeson et al. | 371/22.4 |
| 5,101,409 | 3/1992 | Hack | 371/21.3 |
| 5,119,378 | 6/1992 | Welles, II et al. | 371/22.5 |
| 5,162,663 | 11/1992 | Combs et al. | 307/29 |
| 5,265,100 | 11/1993 | McClure et al. | 371/21.2 |
| 5,299,202 | 3/1994 | Vaillancourt | 371/11.1 |
| 5,317,573 | 5/1994 | Bula et al. | 371/10.3 |
| 5,343,478 | 8/1994 | James et al. | 371/22.3 |

OTHER PUBLICATIONS

IBM TDB, vol. 14 No. 10, Mar. 1972; "N-Way Testpoint For Complex LSI Design"; A. D. Savkar.

Primary Examiner—Vincent P. Canney
Attorney, Agent, or Firm—Richard M. Goldman

[57] ABSTRACT

A circuit, as a logic circuit or a memory circuit, having testing latches. The testing latches include an input latch, a slave latch, and true and complement output latches. The output of the slave latch is NANDed with a DESELECT signal to deselect the output latches. The testing latches can be used in a method of characterizing or testing a memory or logic integrated circuit with scannable output latches. At least one output latch has an input latch, a slave latch, and an output latch which may contain a Complement Latch, and a True latch. In the testing process an output of the slave latch is NANDed with a deselect signal to allow testing or characterization by masking known "fail" signals.

17 Claims, 8 Drawing Sheets

STATIC LATCH WITH LOGIC TO DESELECT XOR GATE.

5,539,753

METHOD AND APPARATUS FOR OUTPUT DESELECTING OF DATA DURING TEST

FIELD OF THE INVENTION

The invention relates to self testing logic circuitry and memory arrays, and more particularly to a method and apparatus for deselecting of data during test, such as known fails.

BACKGROUND OF THE INVENTION

There are a number of situations that can cause a memory array or logic circuitry to display "fails" which are detected by a BIST (Built In Self Tester), or other kinds of logic and memory tests. Early user hardware and circuit characterization are two typical examples of where circuits can exhibit fails that are to be further investigated. These fails can occur because of mask defects, logic or memory design errors, logic or memory test errors, or the like. In each of these cases, characterization of the parts of the memory array or logic circuits that did not fail is essential. However, characterization of the portions of the memory array or logic circuitry that did not fail is not within the designed capability of BIST. BIST does not allow disabling of known fails.

While testing a memory array or logic circuit with BIST, a single understood fail will cause the fail flag to become active and thus potentially mask other fails in the circuit. This means that after each cycle the test must be stopped and the data in each of the output latches examined to determine if the fail flag is masking other fails in the memory array or logic circuitry. Thus the circuit characterization test becomes much more labor intensive, and a complete test can not easily be performed because of the required cycle by cycle analysis.

OBJECTS OF THE INVENTION

It is an object of the invention to provide a method and apparatus for continued testing of a memory array or logic circuitry after deselecting understood fails.

It is a further object of the invention to bypass determined mask defect fails.

It is a still further object of the invention to bypass observed design defect fails.

It is a still further object of the invention to allow for shipment of early user hardware with acceptable fails.

It is a still further object of the invention to reduce design passes by allowing full testing/characterization of previously masked fails which may otherwise not be detected until further design revisions.

SUMMARY OF THE INVENTION

The disclosed invention provides the capability to deselect any one or more of the outputs of scannable latches that drive compression circuitry or a multiple input signature register (MISR). By doing so, one can choose not to observe specific data outputs that are known to cause a "fail" for any particular reason. In this way one can bypass determined mask defects, or observed design defects, which in turn may allow for shipment of early user hardware with acceptable fails, and may also allow for reduction of design revisions.

This provides the capability to further characterize hardware without having to sort through known "fails", which in some cases occur every cycle. Without the method and apparatus of this invention, if such fails do occur, full memory array or logic circuitry characterization would not be possible without the laborious task of scanning out after each cycle and examining the scan chain data for masked fails. In addition, the method and apparatus of the invention allows screening of early user hardware with known failing signatures.

According to the invention, interconnection is provided between scannable output latches for deselecting one or more outputs going to a compression circuit or MISR. The latches may be dynamic with precharged low true/complement outputs. Dynamic latches may be advantageous because of the size of the compression being performed. Alternatively, static latches may advantageously be used, as will be described hereinbelow.

Compression may be performed with a dynamic Exclusive Or (XOR) gate, where the output data is compared with the corresponding expected data. An XOR requires both true and complement signals to be orthogonal to evaluate. If both true and complement signals remained in a precharged state, that particular leg of the compression would be disabled. Thus, the particular output would not be observed as a "fail" by the compression circuitry.

For an MISR, at the output of an array the failing output bit is set to a predictable pattern, i.e., $V_{DD}$, and the MISR signature recalculated to allow for observation of other fails.

The scan latch circuit has an input latch L1, a slave or data transmission latch L2, and an output latch L4. According to the invention an output of the slave latch L2 is NANDed with a deselect signal to deselect the signals from the appropriate Complement and True output latches L4.

THE FIGURES

The invention may be understood by reference to the FIGURES.

DETAILED DESCRIPTION OF THE INVENTION

The disclosed invention provides the capability to deselect any one or more of the outputs of scannable latches that drive compression or MISR circuitry. By doing so, one can choose not to observe specific data outputs that are known to cause a "fail" for any particular reason. This provides the capability to further sequentially characterize the memory or logic hardware without having to sort through known "fails", which in some cases occur in every cycle. If such known fails do occur, full memory or logic characterization is not easily accomplished without the method and apparatus of this invention. In addition, the method and apparatus of the invention allows enhanced screening of early user hardware with known failing signatures.

According to the invention, interconnection is provided between scannable output latches for deselecting one or more outputs going to a compression circuit or an MISR. The latches may be dynamic with precharged low True/

Complement outputs. Dynamic latches are advantageous in a high performance system where a large number of data outputs are being compressed simultaneously. However, static latches may also be used in the practice of the invention.

Compression may be performed with an Exclusive Or (XOR) gate, where the output data is compared with the corresponding expected data. An XOR requires both the true and complement signals be orthogonal in order to evaluate. If both the true and complement signals remained in a precharged state, that particular leg of the compression would be disabled. Thus, the particular output would not be observed as a "fail" by the compression circuitry.

In one embodiment the invention provides a method of supplying the same data to both inputs of an XOR gate. Providing the same state on both inputs of an XOR gate will calculate a compare and provide a ZERO from the output of the XOR gate, which identifies a passing condition all the time, and thus ignores the failing states of the particular output. This embodiment may be used with static or dynamic logic.

Figure 1:
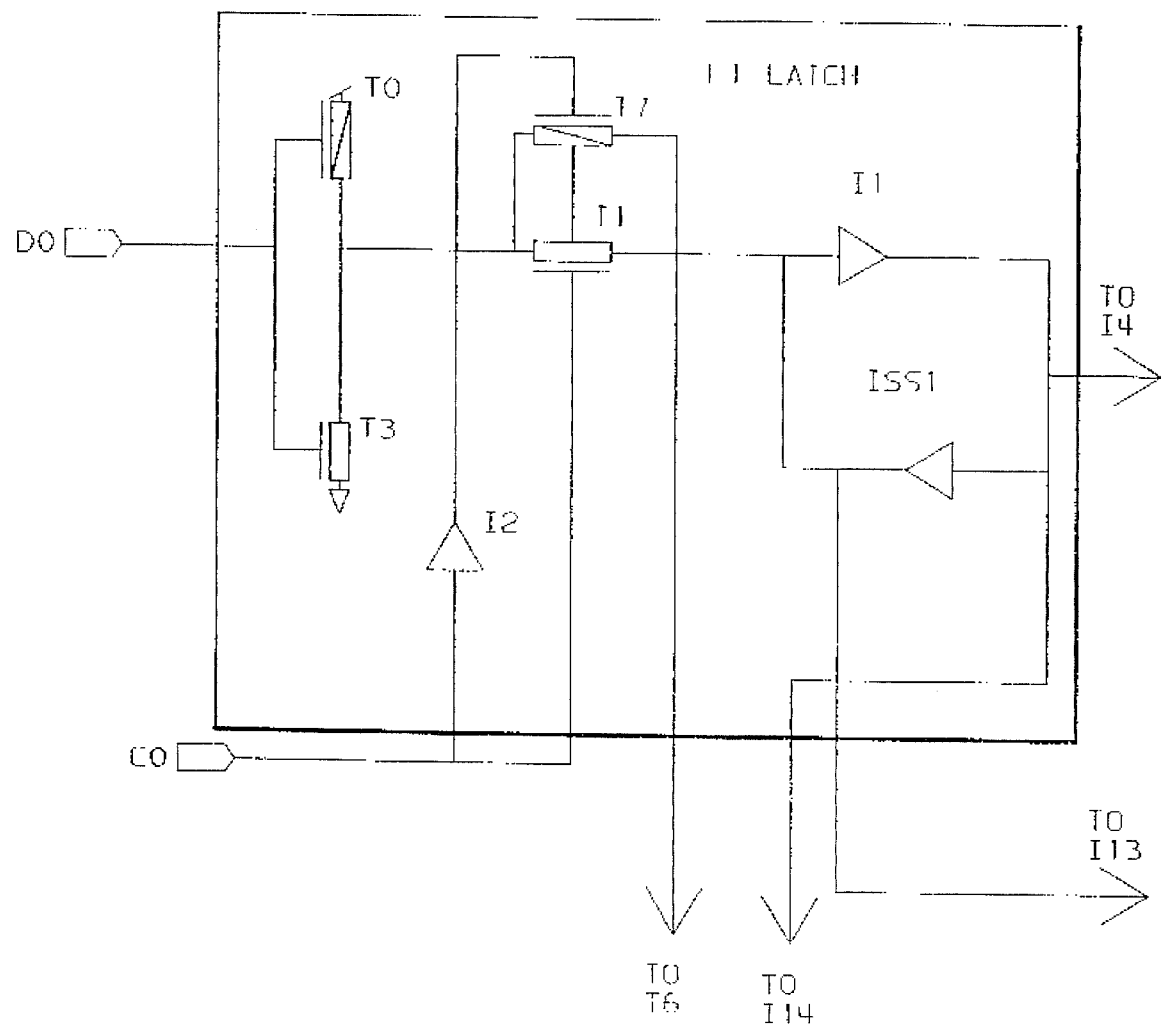
FIG. 1 shows the test circuit of the prior art with a Data Input (DO, I0) latch L1, a data transmission latch L2, and a test data output latch L4.
Figure 1:
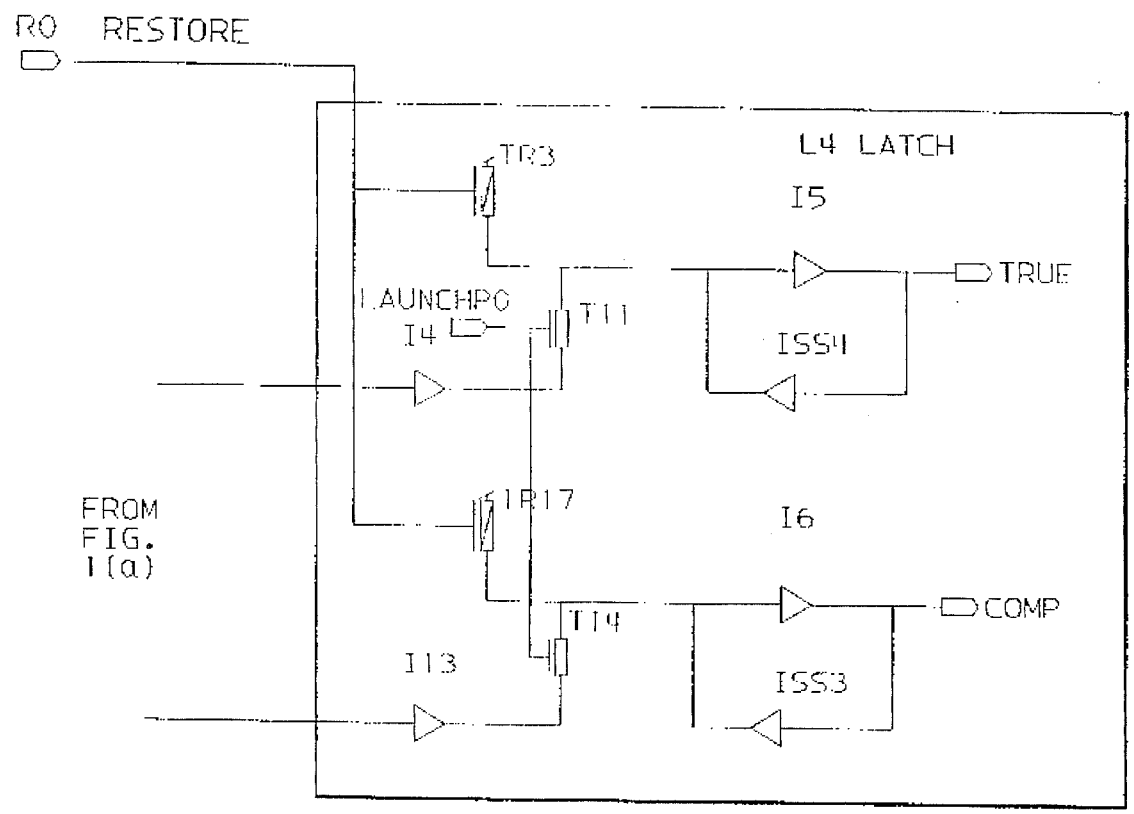
Figure 1C:
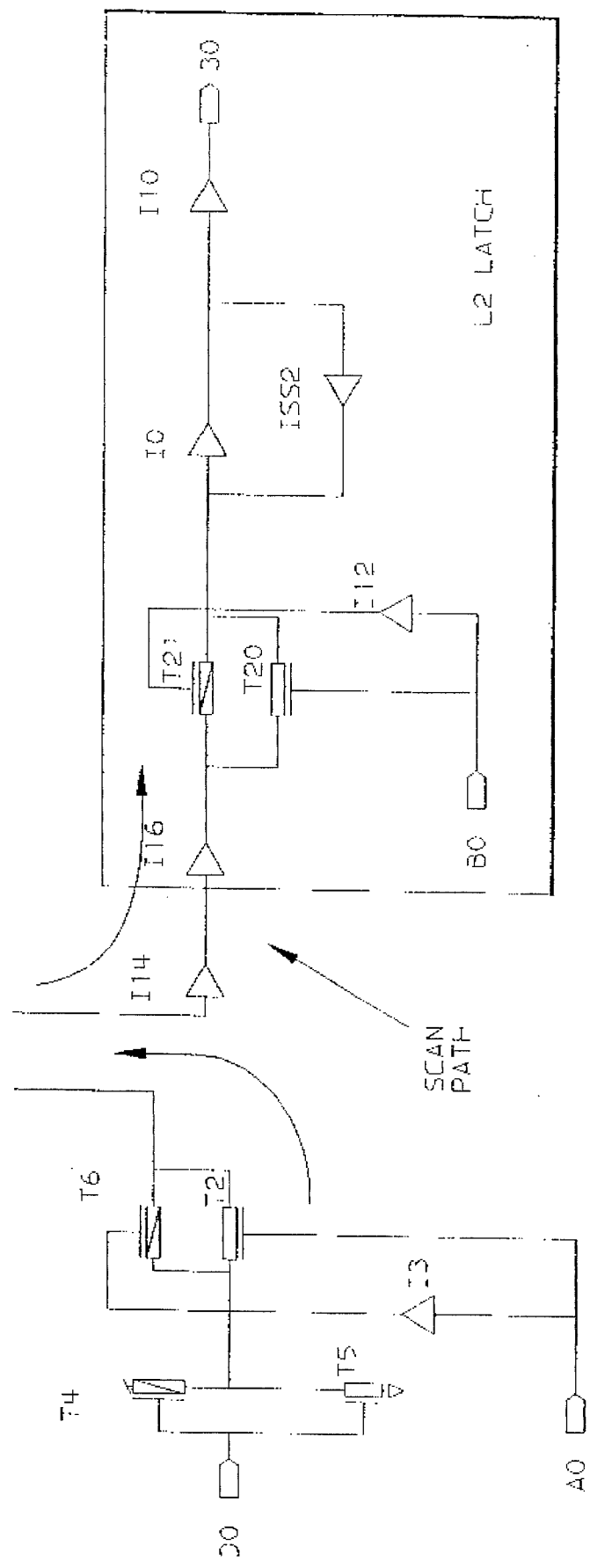

The schematic diagram in FIG. 1 illustrates the Prior Art. The dynamic scannable latches require three independent latches to function. These are identified in FIG. 1 as L1, L2, and L4. The data input latch L1 and the slave latch L2, are used for the scan path, and the data input L1 and data output L4 latches, are used for the test path. Data output latch L4 is a dynamic latch that generates precharged low True and Complement outputs that feed compression circuitry. When both true and complement signals are in a precharged state, the particular output feeding the compression circuit would be disabled, and the particular output would not be observed as a "fail" by the compression circuitry. This may be accomplished by turning off the launch clock (PO). However, this is not a practical alternative because turning off the PO clock would deselect the output drivers of all the dynamic latches.

Figure 2A:
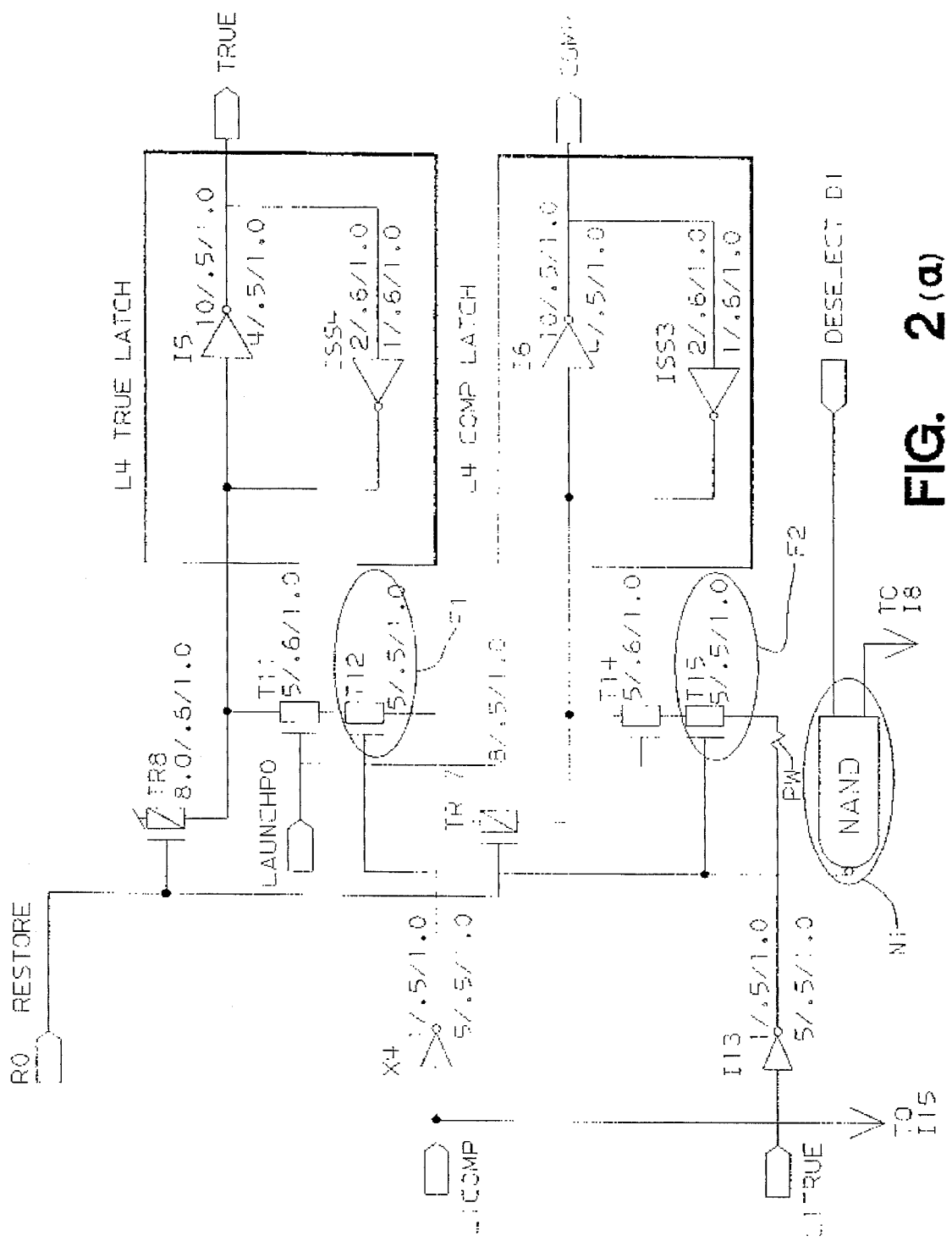
FIG. 2 shows the deselect circuitry of the present invention for the data transmission latch L2, and the test data output latch L4.
Figure 2B:
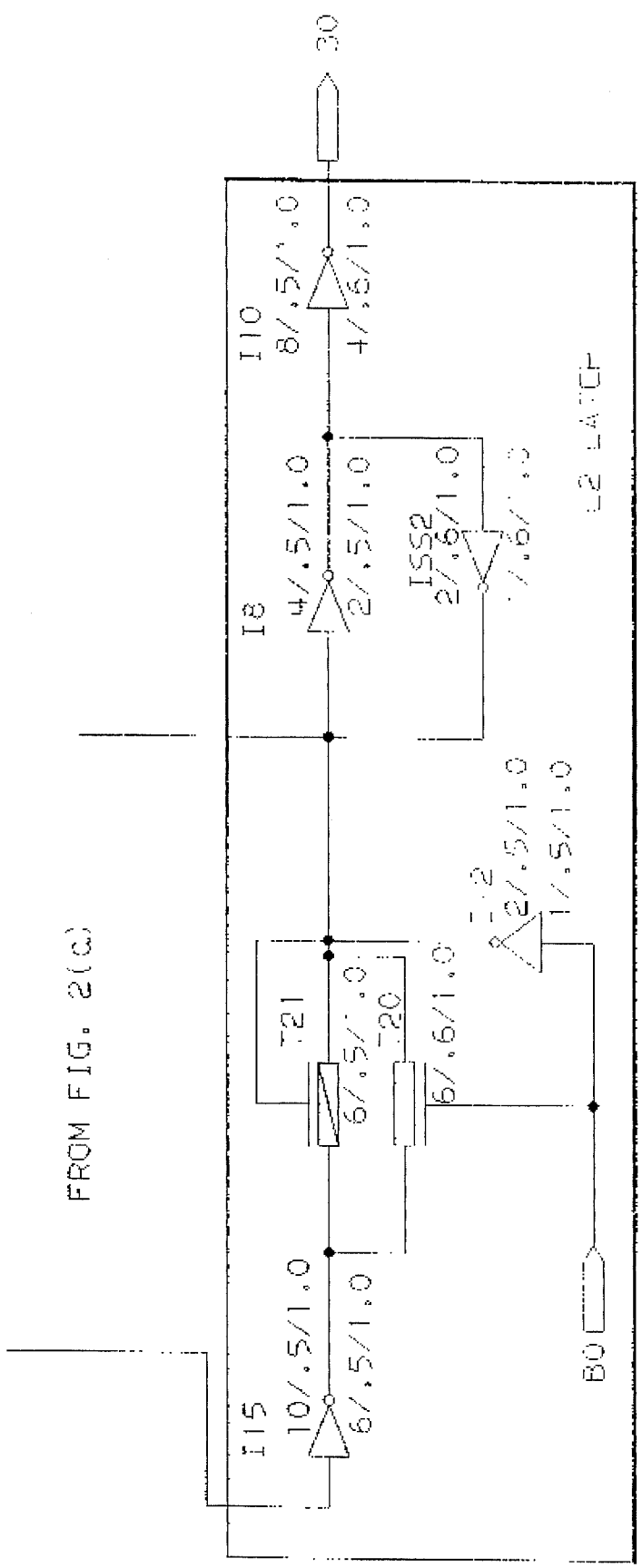

In order to selectively turn off individual dynamic latch output drivers, we use the latch configuration of our invention as illustrated in FIG. 2. The scan latch circuit has a data input master latch L1, and a slave latch L2 for either or both of data transmission or holding the deselect signature, and a data output latch L4. According to the invention, as illustrated in FIG. 2, an output of the slave latch L2 is NANDed with the deselect signal. When the slave latch L2 contains a ONE and the deselect signal is asserted, the output of the NAND gate prevents the fail data captured in the data input latch L1 from propagating through the data output latch L4 to the compression circuitry.

In FIG. 2 the black ovals denote certain aspects of the circuit of the invention. These aspects of the circuit are needed to perform this method of the invention. They are a 2 pin input NAND gate N1, an N-FET F1 and F2 in the pull down path of both the True and Complement output latches comprising the L4 dynamic latch, and a global deselect signal D1, which can be designed to switch on the fly during at speed testing to enable deselecting of specified outputs only during known failing patterns.

Built in self testing may be started by flushing ZEROs through the scan chain. The tester can be programmed to load a ONE into the output latch(es) L2 that are desired to be deselected during built in self testing. The latches are loaded through the scan chain by toggling the scan clocks. The A clock opens the master latch L1 and the B clock opens the slave latch L2. By ending the scan chain operation with a B clock, the data stored in the master latch L1 will be loaded into the slave latch L2. A ONE would be stored in the slave latch L2 of the desired output latch to deselect. The ONE in the slave latch L2 would then drive the NAND gate N1 along with the global deselect signal that originates from a primary input pin or an on chip scan only latch. This causes the data output true and complement latches L4 to remain in their precharged state by cutting off the pull down paths to ground as illustrated in FIG. 2.

Storing a ONE in the slave latch L2 does not adversely effect built in self testing or any other type of test. The output of the memory array or logic circuitry is observable through the scan chain, whether the output latches are placed in a deselect mode or not.

Static data output latches L4 are required to drive static compression circuitry. The output of the static latch L4 does not have a precharged state and can not deselect a data output by method of the data output dynamic latch L4. The method of deselecting a static output to a static compression circuit is to ensure that both inputs to the XOR gate are the same when that memory output is to be deselected.

Figure 3:
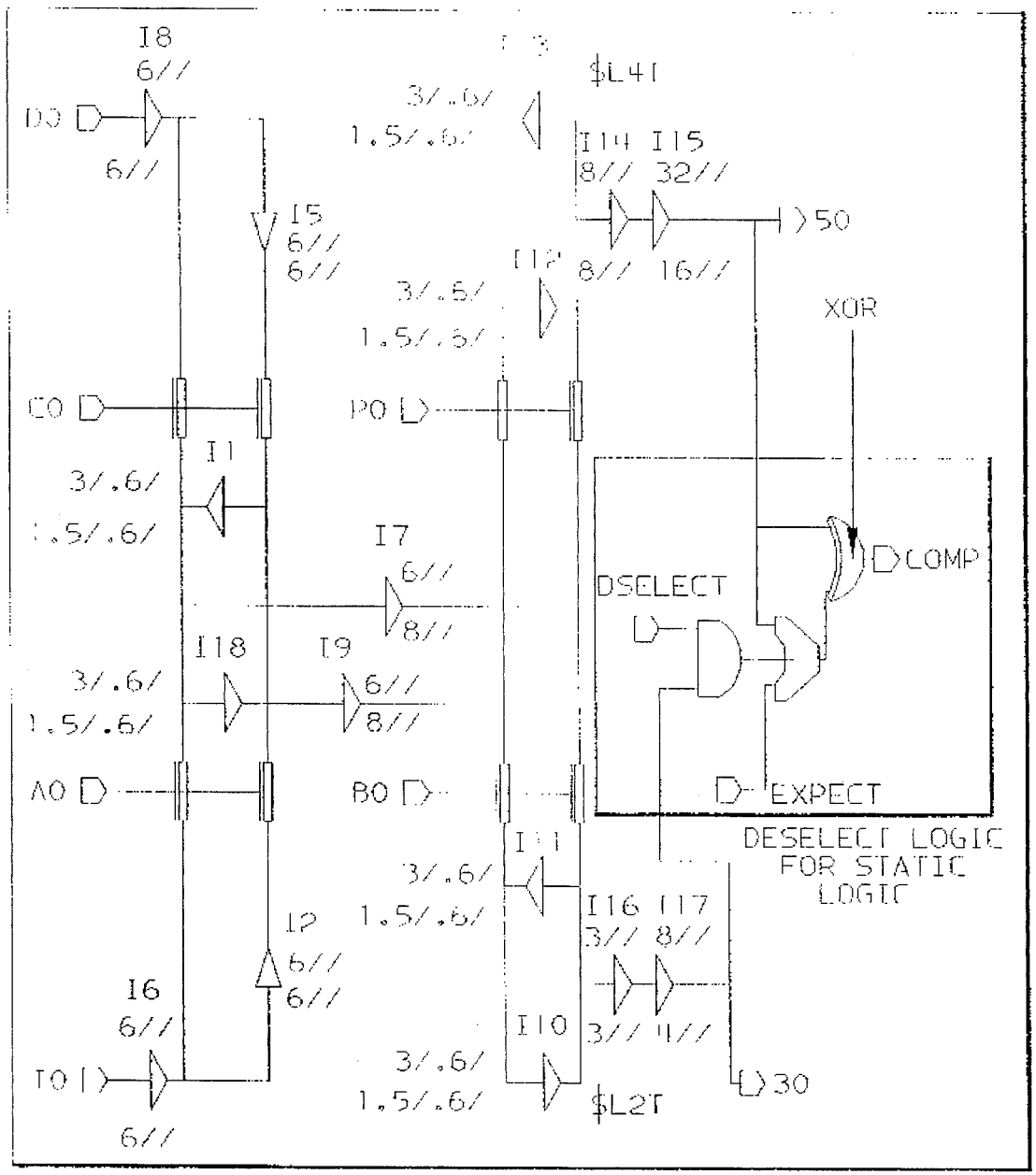
FIG. 3 shows a static implementation.

FIG. 3 illustrates the static latches L1, L2 and L4 and how the output of the output latch L4 is sent to the input of an XOR gate and a multiplexor, where the multiplexor can select between the expected data and the output latch L4 output data. The multiplexor path selection is controlled by an AND gate that receives inputs from the global deselect signal and the data stored in the slave latch L2. When the global deselect signal is active (high) and a ONE is stored in the slave latch L2, the output of the memory array is to be deselected and the multiplexor selects the data from the L4 to be applied to the second input of the XOR gate. The XOR gate would then always have the same data applied to both inputs and never exhibit a fail from that particular output, thus deselecting that particular output.

In addition to the static logic implementation of this invention with compression circuitry at memory or logic outputs, there is a further application of output deselecting when an MISR is used to capture output data. A large amount of BIST is performed by using an MISR to compact the output results. The key when deselecting an output that feeds an MISR is to supply a predictable pattern that overrides the output of the logic circuit or memory array. This can be accomplished by adding a multiplexor in the output data path before it enters the MISR, or if a multiplexor already exists, as with most memory arrays, adding an additional data path will suffice, where the alternate multiplexor path will be selected in a similar manner as the alternate path in the static output L4 latch implementation in the compression example. The alternate path to the MISR input will supply a predictable data value such as GND or $V_{DD}$ as opposed to the same data from the output latch L4 as in the static compression circuit example.

Figure 4:
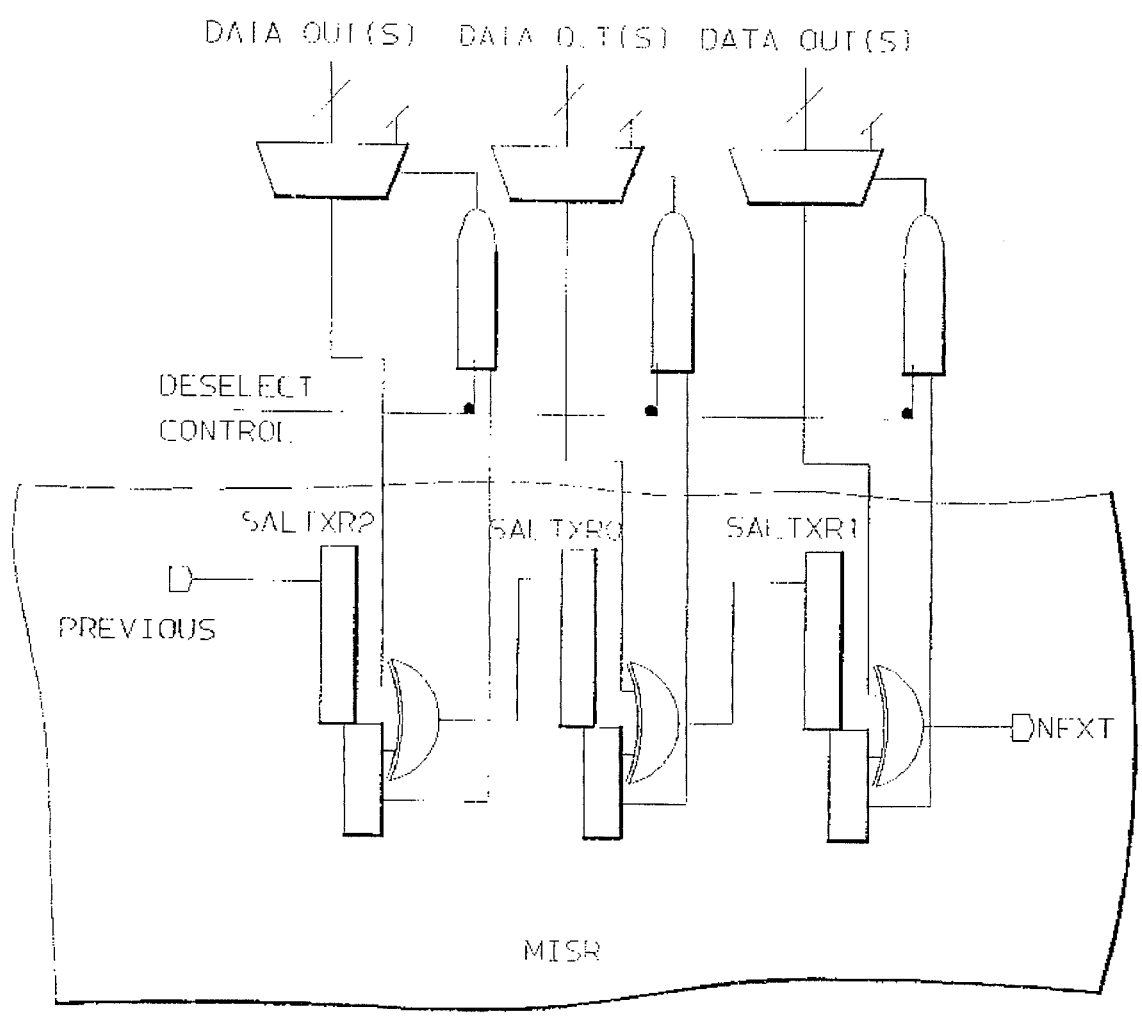
FIG. 4 shows an MISR Implementation of invention for memory and logic outputs.

FIG. 4 illustrates an MISR which has a multiple input multiplexor where an additional path was added for the deselection of that particular output. The same numerals have the same meaning as in FIGS. 1 and 2.

The MISR calculates a single unique signature for every sequence of data. This signature is continuously calculated and recalculated as the outputs emerge from the memory or logic being tested. If one output for any one or more cycles is incorrect, the final signature will not match the expected signature. Then, the known failing outputs can be set to a predictable value through the entire test and a new expected signature can be calculated to see if any other outputs exhibit a fail.

Figure 5:
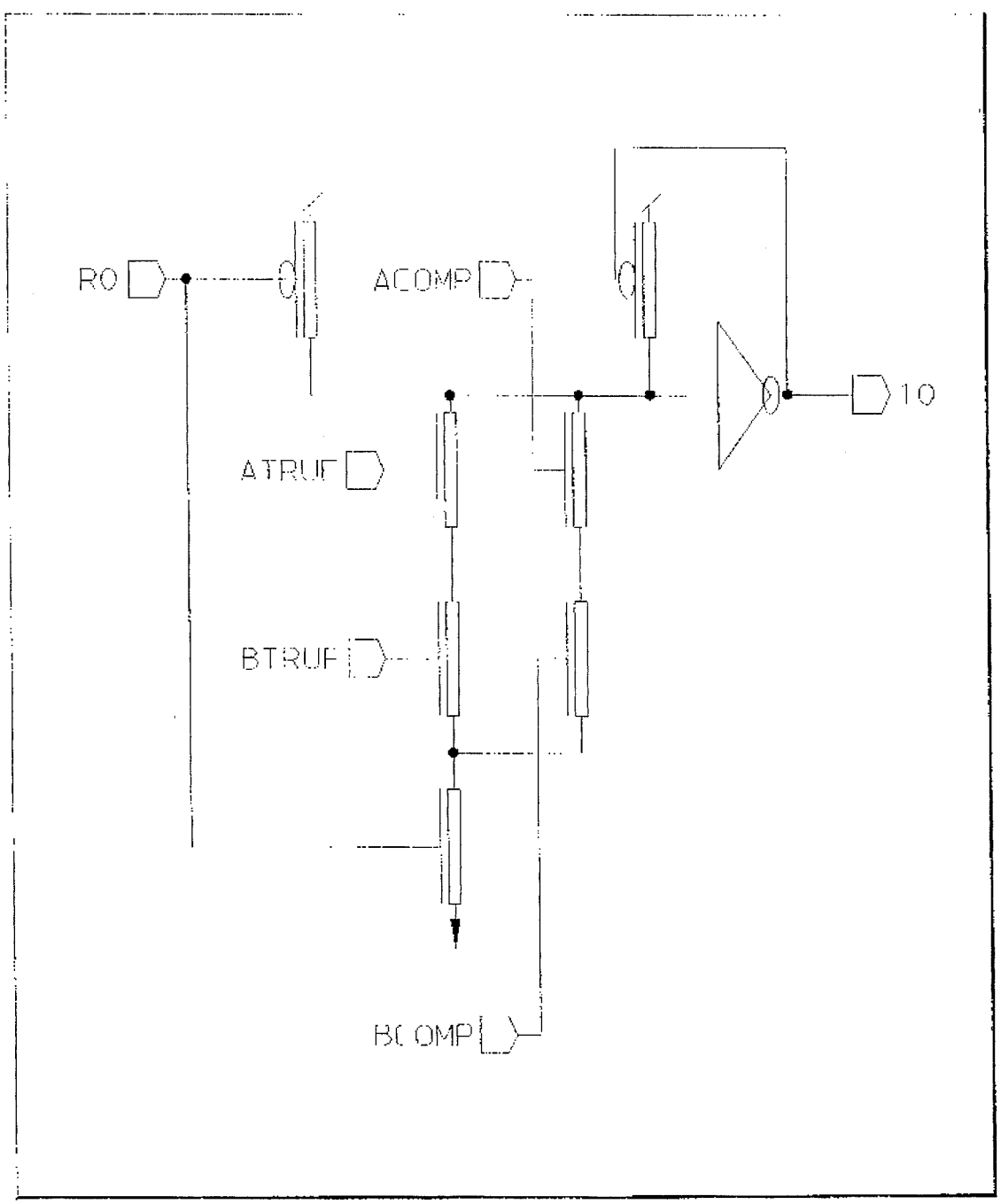
FIG. 5 shows a dynamic XOR gate and its inputs.

The logic associated with providing the deselecting capability is not limited to the logic shown in the FIGURES or described herein. The method and apparatus of the invention ensures that the XOR gate never generates a fail condition (output=ONE) when it is deselected in the case of the compression test circuitry, or provide a predictable value or pattern on the deselected memory or logic output to a MISR. This may be accomplished by keeping the inputs of a true/complement pair at its precharged state, or by insuring that the two inputs to the XOR gate are the same. A dynamic XOR * gate with its inputs is shown in FIG. 5.

The global deselecting signal is associated with the present embodiment of the invention but need not be present for output deselecting to occur. The data in the slave latch L2 can by itself be used to deselect any dynamic or static output latch L4 to a compression circuit or a MISR.

While the invention has been described with respect to certain preferred embodiments and exemplifications, it is not intended to limit the scope of the invention thereby, but solely by the claims appended hereto. For example, while the FIGUREs show NAND gates, it is, of course, to be understood that OR gates or other equivalent logic can be used. Furthermore, the output of the transmission latch can be directly connected to element F1 in FIG. 2. In a still further embodiment of the invention, a single output latch may be used in the connection with the static logic implementation of the invention.

We claim:

1. In a circuit having testing latches comprising a data input latch, a data transmission latch, and data output true and complement latches, the improvement wherein the output of the data transmission latch is NANDed with a DESELECT signal to deselect the data output latches.

2. The circuit of claim 1 having a multiple input signature register for receiving a predictable pattern.

3. The circuit of claim 1 wherein the output of the data transmission latch deselects the data output latch directly.

4. A method of characterizing or testing an integrated circuit with scannable output latches, at least one output latch thereof having a data input latch, a data transmission slave latch, a Complement Output Latch, and a True Output latch, comprising NANDing an output of the data transmission slave latch with a deselect signal to allow testing or characterization without "fail" signals.

5. The method of claim 4 comprising providing a predictable pattern to a multiple input signature register.

6. A method of characterizing or testing an integrated circuit with scannable output latches, at least one output latch thereof having a data input latch, a data transmission slave latch, a Complement Output latch, and a True Output latch, comprising providing an output of the data transmission slave latch to allow testing or characterization without propagation of known "fails".

7. In a circuit having testing latches, each testing latch comprising a data input latch, a data transmission slave latch, and a data output latch, the improvement wherein the output of the data transmission latch is ANDed with a DESELECT signal to provide a path selection through a multiplexor, wherein said path selection provides data from the output latch to deselct "fail" generation.

8. The circuit of claim 7 wherein the output of the data transmission slave latch provides a path selection for the multiplexor, and wherein the path selection of the data from the output latch deselects the "fail" generation of that output.

9. A method of characterizing or testing an integrated circuit with scannable output latches, at least one output latch thereof having a data input latch, a data transmission latch, and a data output latch, said method comprising ANDing an output of a data transmission latch with a deselect signal to allow testing or characterization without propagation of known "fails".

10. A method of characterizing or testing an integrated circuit with scannable output latches, at least one output latch thereof having a data input latch, a data transmission slave latch, and a data output latch, comprising providing an output of the data transmission slave latch to allow testing or characterization without propagation of known "fails".

11. In a circuit having a multiple input signature register with testing latches comprising a data input latch, a data transmission latch, a data output latch, the improvement wherein the output of the data transmission latch is NANDed with a DESELECT signal to provide an alternate path selection through a multiplexor, whereby said alternate path provides a predictable pattern to the multiple input signature register thereby deselecting the circuit output.

12. The circuit of claim 11 further comprising data output TRUE and COMPLEMENT latches.

13. The circuit of claim 11 whereby the output of the data transmission latch provides an alternate data selection path for a multiplexor, whereby the alternate path provides a predictable pattern to the multiple input signature register thereby deselecting the circuit output.

14. A method of characterizing or testing an integrated circuit with scannable output latches, at least one output latch thereof having a data input latch, a data transmission latch, and a data output latch, said method comprising NANDing an output of the data transmission slave latch with a DESELECT signal to provide a predictable pattern to a multiple input signature register, thereby allowing testing or characterization without fail signal propagation.

15. The method of claim 14 wherein the scannable output latch further comprises data output TRUE and COMPLEMENT latches.

16. A method of characterizing or testing an integrated circuit with scannable output latches, at least one output latch thereof having a data input latch, a data transmission slave latch, and a data output latch, said method comprising providing an output of the data transmission slave latch to thereby provide a predictable pattern to a multiple input signature register, thereby allowing testing or characterization without fail signal propagation.

17. The method of claim 16 wherein the scannable output latch further comprises data output TRUE and COMPLEMENT latches.

* * * * *